United States Patent
Son et al.

(10) Patent No.: US 11,211,405 B2
(45) Date of Patent: Dec. 28, 2021

(54) VARIABLE LOW RESISTANCE LINE NONVOLATILE MEMORY DEVICE AND METHOD FOR OPERATING SAME

(71) Applicant: VMEMORY CORP., Suwon-si (KR)

(72) Inventors: Jong Hwa Son, Yongin-si (KR); Jong Yeog Son, Hwaseong-si (KR)

(73) Assignee: VMEMORY CORP., Suwon-si (KR)

(*) Notice: Subject to any disclaimer, the term of this patent is extended or adjusted under 35 U.S.C. 154(b) by 0 days.

(21) Appl. No.: 17/290,630

(22) PCT Filed: Oct. 24, 2019

(86) PCT No.: PCT/KR2019/014052
§ 371 (c)(1),
(2) Date: Apr. 30, 2021

(87) PCT Pub. No.: WO2020/091307
PCT Pub. Date: May 7, 2020

(65) Prior Publication Data
US 2021/0313336 A1      Oct. 7, 2021

(30) Foreign Application Priority Data
Nov. 2, 2018    (KR) .................. 10-2018-0133895

(51) Int. Cl.
*H01L 27/1159*        (2017.01)
*G11C 11/22*          (2006.01)
*H01L 27/11587*       (2017.01)

(52) U.S. Cl.
CPC ........ *H01L 27/1159* (2013.01); *G11C 11/223* (2013.01); *H01L 27/11587* (2013.01)

(58) Field of Classification Search
CPC .............. G11C 11/22; H01L 27/1159
(Continued)

(56) References Cited

U.S. PATENT DOCUMENTS

| 2007/0069263 A1* | 3/2007 | Mizuuchi ............ H01L 45/1206 257/295 |
| 2007/0128798 A1 | 6/2007 | Lee |
| 2018/0197879 A1* | 7/2018 | Kang .................... H01L 29/516 |

FOREIGN PATENT DOCUMENTS

| KR | 2006-0010785 A | 2/2006 |
| KR | 2006-0106165 A | 10/2006 |

(Continued)

OTHER PUBLICATIONS

Notice of Allowance dated Jun. 27, 2019 in Korean Patent Application No. 20180133895 filed Nov. 2, 2018,3 pages.*

(Continued)

*Primary Examiner* — Muna A Techane
(74) *Attorney, Agent, or Firm* — Kilpatrick Townsend & Stockton LLP

(57) ABSTRACT

A variable low-resistance line memory device and an operating method thereof are provided. The memory device includes: a base including a spontaneous polarizable material; a gate arranged adjacent to the base; at least two polarization regions formed in the base by applying an electric field to the base through the gate, the at least two polarization regions having polarization in different directions from each other; a variable low-resistance line corresponding to a boundary between the at least two polarization regions selectively having polarization in different directions from each other; a source located to contact the variable low-resistance line; and a drain located to contact the variable low-resistance line, wherein the variable low-resistance line is formed in a region of the base, the region having a lower electrical resistance than other regions of the base adjacent to the variable low-resistance line.

16 Claims, 23 Drawing Sheets

(58) Field of Classification Search
USPC .......................................................... 365/145
See application file for complete search history.

(56) References Cited

FOREIGN PATENT DOCUMENTS

| | | |
|---|---|---|
| KR | 2008-0030732 A | 4/2008 |
| KR | 2018-0106661 A | 10/2018 |

OTHER PUBLICATIONS

Notice of Non-Final Rejection dated Jan. 22, 2019 in Korean Patent Application No. 20180133895 filed Nov. 2, 2018,13 pages.*
International Search Report and Written Opinion dated Feb. 5, 2020 in International Patent Application No. PCT/KR2019/014052, filed Oct. 24, 2019, 9 pages.

* cited by examiner

VARIABLE LOW RESISTANCE LINE NONVOLATILE MEMORY DEVICE AND METHOD FOR OPERATING SAME

TECHNICAL FIELD

One or more embodiments relate to a variable low-resistance line non-volatile memory device and an operating method thereof.

BACKGROUND ART

As technology progresses and people's interest in the convenience of life increases, attempts to develop various electronic products are being actively made.

Such electronic products are becoming more compact and integrated and are increasingly used in numerous places.

These electronic products include various electric elements, for example, a CPU, a memory, and other various electric elements. These electronic elements may include various types of electrical circuits.

For example, electric elements are used in products of various fields such as computers, smartphones, home sensor devices for IoT, and bio-electronic elements for ergonomics.

Due to the speed of the recent technological development and the rapid improvement in the living standards of users, the use and application fields of these electric elements have rapidly increased, and the demand thereof has also increased accordingly.

According to this trend, there is a limitation in implementing and controlling an electric circuit that is easily and quickly applied to various electric elements that are commonly used.

Meanwhile, a memory device, particularly a non-volatile memory device, has been widely used as an information memory and/or processing device of various electronic devices such as not only a computer but also a camera, a communication device, and the like.

The memory device has been developed in terms of its lifespan and speed, and most of the objectives are to secure a memory lifespan and speed, but there is a limit due to specific limitations of each memory device.

In addition to the research on conventional silicon-based memory devices, recently, research on ferroelectric memory (Fe-RAM), resistive memory (ReRAM), phase change memory (P-RAM), and the like, as next-generation memories, has been conducted.

The ferroelectric memory uses a principle similar to that of the conventional DRAM, in which a ferroelectric material is used as a dielectric film in a middle of a capacitor, and when an electric field is applied to the ferroelectric material, charges are accumulated in the capacitor. Since the ferroelectric memory needs to utilize ferroelectric polarization according to the high integration of a device, there is a limitation in reducing the size of the capacitor. Accordingly, since the size of the memory device cannot be reduced to a predetermined size or less, there is a limit in data storage capacity.

The resistance change memory allows switching characteristics to occur due to ionization of a metal or oxygen deficiency, and as a result, since a material needs to be changed for resistance change, deterioration of a device may occur.

Phase change memory uses a difference in a specific resistance of a Ge—Sb—Te-based phase change layer between an amorphous state and a crystalline state, and since a phase change of the material is used, degradation of a device may also occur due to long hours of use.

DESCRIPTION OF EMBODIMENTS

Technical Problem

The conventional next-generation memory devices as described above have numerous limitations in terms of a degree of integration of devices, the lifetime of the devices, and/or a limited memory speed.

Embodiments of the present disclosure are directed to address the above-described problems, limitations, and/or necessity and provide a memory device that allows an increased data retention period, a high memory speed, and an increased device integration, and an operating method of the memory device.

Solution to Problem

One or more embodiments of the present disclosure include a variable low-resistance line memory device including a base including a spontaneous polarizable material; a gate arranged adjacent to the base; at least two polarization regions formed in the base by applying an electric field to the base through the gate, the at least two polarization regions having polarization in different directions from each other; a variable low-resistance line corresponding to a boundary between the at least two polarization regions selectively having polarization in different directions from each other; a source located to contact the variable low-resistance line; and a drain located to contact the variable low-resistance line, wherein the variable low-resistance line is formed in a region of the base, the region having a lower electrical resistance than other regions of the base adjacent to the variable low-resistance line.

According to another embodiment, the at least two polarization regions may include a first region having a polarization in a first direction and a second region selectively having a polarization in a second direction opposite to the first direction, and the variable low-resistance line may be between the first region and the second region.

According to another embodiment, the first region and the second region may have a same thickness.

According to another embodiment, the second region may have a first thickness, and the first region may include a portion having a second thickness greater than the first thickness.

According to another embodiment, the variable low-resistance line may electrically connect the source to the drain.

According to another embodiment, the variable low-resistance line may be located apart from the gate.

According to another embodiment, the variable low-resistance line may be generated or disappeared according to the control of the at least two polarization regions by controlling an electric field through the gate, and after the electric field is removed, a shape of the variable low-resistance line may be maintained to have non-volatile characteristics of information.

According to another embodiment, a depth of the variable low-resistance line may be controlled in a thickness direction of the base by controlling an intensity of the electric field through the gate.

According to another embodiment, a size of the variable low-resistance line may be controlled by controlling an application time of the electric field through the gate.

According to another embodiment, the base may include a ferroelectric material.

According to another embodiment, the variable low-resistance line may be maintained even when the electric field applied through the gate is removed.

One or more embodiments of the present disclosure include an operating method of a non-volatile memory device including: a base including a spontaneous polarizable material; a gate arranged adjacent to the base; and a source and a drain arranged apart from the gate and to contact the base, wherein the operating method includes: forming, in the base, a first region having a polarization in a first direction; forming a second region that is adjacent to the gate of the first region and has a polarization in a second direction opposite to the first direction, by applying a first voltage to the base through the gate; and forming a variable low-resistance line that is located between the first region and the second region and is electrically connected to the source and the drain, by growing the second region by maintaining the first voltage in the base for a first period of time through the gate.

According to another embodiment, the operating method may include: converting the second region adjacent to the gate into the first region having the polarization in the first direction by applying a second voltage to the base through the gate; and allowing the first region to pass by the variable low-resistance line by growing the first region by maintaining the second voltage in the base for a second period time through the gate.

According to another embodiment, the second voltage may be different from the first voltage.

According to another embodiment, the second period of time may be equal to or longer than the first period of time.

According to another embodiment, the variable low-resistance line may be maintained even when application of the first voltage to the gate is ended.

Other aspects, features, and advantages other than those described above will become clear from the following drawings, claims, and detailed description of the present disclosure.

Advantageous Effects of Disclosure

According to example embodiments of the present disclosure described above, a memory device that allows an increased data retention period, a high memory speed, and an increased device integration may be provided.

MODE OF DISCLOSURE

Figure 1:
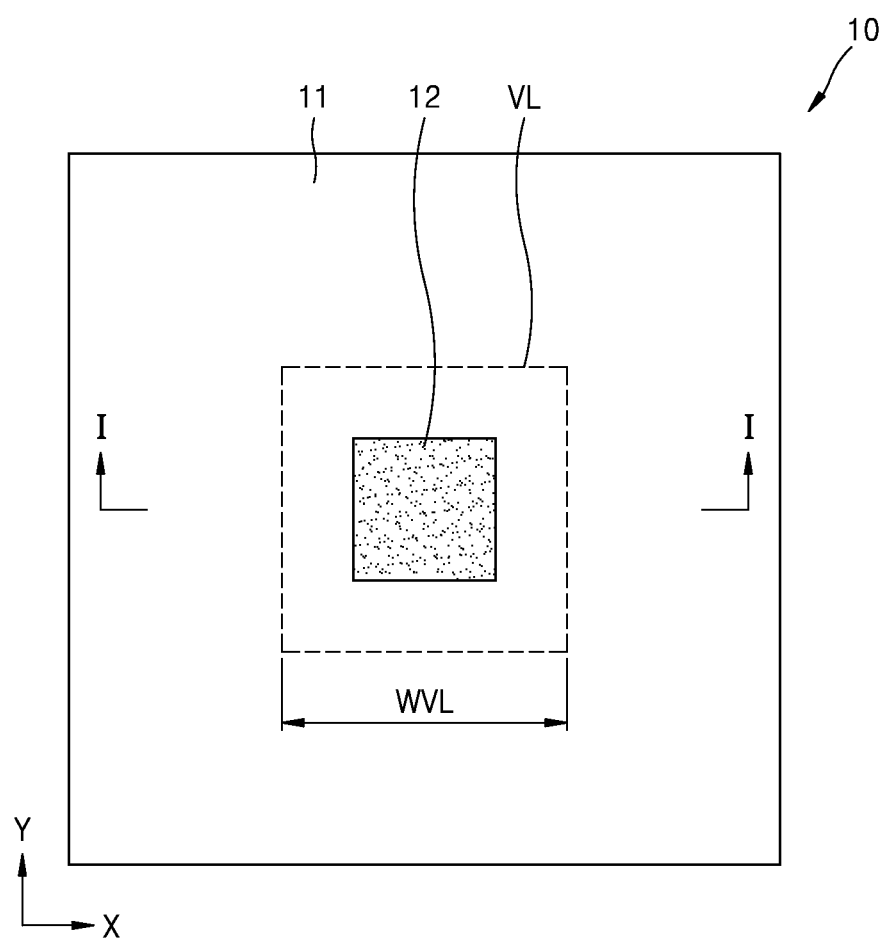
FIG. 1 is a schematic plan view illustrating an electronic element according to an embodiment of the present disclosure.

Hereinafter, the configuration and operation of the present disclosure will be described in detail with reference to embodiments of the present disclosure shown in the accompanying drawings.

As the present disclosure allows for various changes and numerous embodiments, particular embodiments will be illustrated in the drawings and described in detail in the written description. The effects and features of the present disclosure and methods of achieving them will become clear with reference to the embodiments described in detail below together with the drawings. However, the present disclosure is not limited to the embodiments disclosed below, but may be implemented in various forms.

Hereinafter, the embodiments of the present disclosure will be described in detail with reference to the accompanying drawings, and in the description with reference to the drawings, like reference numerals refer to like elements, and repeated description thereof will be omitted.

In the embodiments below, it will be understood that although the terms "first," "second," etc., may be used herein to describe various elements, these elements should not be limited by these terms. These terms are only used to distinguish one element from another.

In the embodiments below, the singular forms include the plural forms unless the context clearly indicates otherwise.

In the embodiments below, it is to be understood that the terms such as "including" or "having" are intended to indicate the existence of the features or elements disclosed in the specification, and are not intended to preclude the possibility that one or more other features or elements may be added.

In the drawings, the sizes of elements may be exaggerated or reduced for convenience of description. For example, since sizes and thicknesses of elements in the drawings are arbitrarily illustrated for convenience of explanation, the present disclosure is not limited thereto.

In the embodiments below, an x-axis, a y-axis, and a z-axis are not limited to three axes on a rectangular coordinates system but may be construed as including these axes. For example, the x-axis, the y-axis, and the z-axis may be orthogonal to each other, but may refer to different directions that are not orthogonal to each other.

When an embodiment is implementable in another manner, a predetermined process order may be different from a described one. For example, two processes that are continuously described may be performed substantially simultaneously, or may be performed in an order opposite to the order described.

Figure 2:
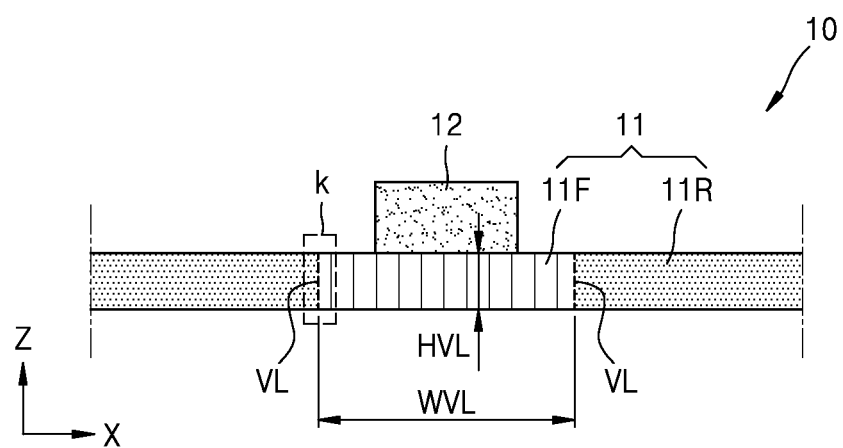
FIG. 2 is a cross-sectional view taken along line I-I of FIG. 1.
Figure 3:
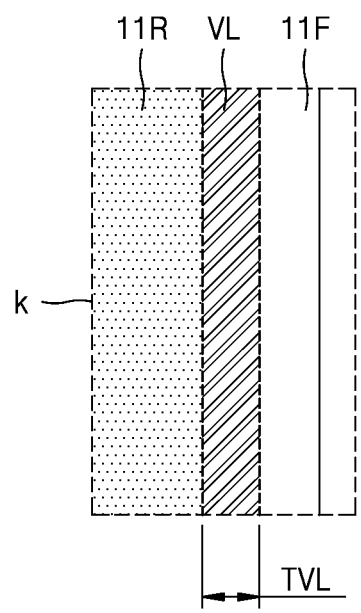
FIG. 3 is an enlarged view of k of FIG. 2.

FIG. 1 is a plan view for describing a method of controlling a current path range by using an electric field according to an embodiment of the present disclosure, FIG. 2 is a cross-sectional view taken along line I-I of FIG. 1, and FIG. 3 is an enlarged view of K of FIG. 2.

Referring to FIGS. 1 and 2, an electronic element 10 according to the present embodiment may include an active layer 11, an application electrode 12, and a variable low-resistance region VL.

The active layer 11 may include a spontaneous polarizable material. For example, the active layer 11 may include an insulating material and a ferroelectric material. That is, the active layer 11 may include a material having a spontaneous electric polarization (electric dipole) that may be reversed in the presence of an electric field.

In some embodiments, the active layer 11 may include a perovskite-based material, for example, $BaTiO_3$, $SrTiO_3$, $BiFe_3$, $PbTiO_3$, $PbZrO_3$, $SrBi_2Ta_2O_9$.

As another example, the active layer 11 may have an ABX3 structure, in which A may include at least one material selected from an alkyl group of CnH2n+1 and an inorganic material such as Cs, Ru, or the like capable of forming a perovskite solar cell structure, B may include at least one material selected from among Pb, Sn, Ti, Nb, Zr, and Ce, and X may include a halogen material. In detail, the active layer 11 may include $CH_3NH_3PbI_3$, $CH_3NH_3PbI_xCl_{3-x}$, $MAPbI_3$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ ($0 \leq x, y \leq 1$).

As the active layer 11 may be formed using other various ferroelectric materials, description thereof will be omitted. In addition, when forming the active layer 11, an additional function may be included or an improvement in electrical characteristics may be added by doping a ferroelectric material with various other materials.

The active layer 11 may have spontaneous polarization, and may be used to control a degree and direction of the polarization according to application of an electric field. In addition, the active layer 11 may maintain a polarization state even when an applied electric field is removed.

The application electrode 12 may be formed to apply an electric field to the active layer 11, for example, to apply a voltage to the active layer 11.

In some embodiments, the application electrode 12 may be formed to contact an upper surface of the active layer 11.

In addition, the application electrode 12 may be formed to apply various magnitudes of voltages to the active layer 11 and to control a period of time for applying a voltage.

In some embodiments, the application electrode 12 may include a gate electrode.

For example, the application electrode 12 may be electrically connected to a power supply (not shown) or a power controller.

The application electrode 12 may include various materials and may include a material having high electrical conductivity. For example, the application electrode 12 may be formed using various metals, and may be formed to include aluminum, chromium, titanium, tantalum, molybdenum, tungsten, neodymium, scandium, or copper. Alternatively, the application electrode 12 may be formed using an alloy of the above materials or a nitride of the above materials.

In addition, in some embodiments, the application electrode 12 may include a stacked structure.

Although not illustrated in the drawings, in some embodiments, one or more insulating layers may be further arranged between the application electrode 12 and the active layer 11.

The variable low-resistance region VL is a region formed in the active layer 11, through which a current may flow, and may be formed as a path of a current having a linear shape around the application electrode 12, as illustrated in FIG. 1.

In detail, the variable low-resistance region VL is a region of the active layer 11, the region having an electrical resistance lower than that of other regions of the active layer 11 that are adjacent to the variable low-resistance region VL.

In addition, after forming the variable low-resistance region VL through the application electrode 12, even when an electric field through the application electrode 12 is removed, for example, even when a voltage is removed, the polarization state of the active layer 11 is maintained, and thus, the variable low-resistance region VL may be maintained and a state in which a path of a current is formed may be maintained.

Accordingly, various electronic elements may be configured.

The variable low-resistance region VL may have a height HVL, and the height HVL may correspond to a total thickness of the active layer 11.

The height HVL of the variable low-resistance region VL may be proportional to an intensity of an electric field applied through the application electrode 12, for example, a magnitude of a voltage. At least, the magnitude of the electric field may be greater than an intrinsic coercive field of the active layer 11.

The variable low-resistance region VL is a region formed as a voltage is applied to the active layer 11 through the application electrode 12, and may be changed, for example, generated and disappeared through the control of the application electrode 12.

The active layer 11 may include a first polarization region 11R having a first polarization direction, and the variable low-resistance region VL may be formed at a boundary of the first polarization region 11R.

In addition, the active layer 11 may include a second polarization region 11F having a second polarization direction to be adjacent to the first polarization region 11R, and the variable low-resistance region VL may be formed at a boundary of the second polarization region 11F. The second direction may be a direction different from at least the first direction, for example, a direction opposite to the first direction.

For example, the variable low-resistance region VL may be formed at a boundary between the first polarization region 11R and the second polarization region 11F.

The variable low-resistance region VL may have a width WVL in a direction, that is, between two variable low-resistance regions VL facing each other, and the width WVL may be proportional to a moving distance of the variable low-resistance region VL, which will be described later.

In some embodiments, as illustrated in FIG. 3, the variable low-resistance region VL may have a certain planar thickness TVL, which may be +/−0.2 nm with respect to 0.3 nm.

Figure 4A:
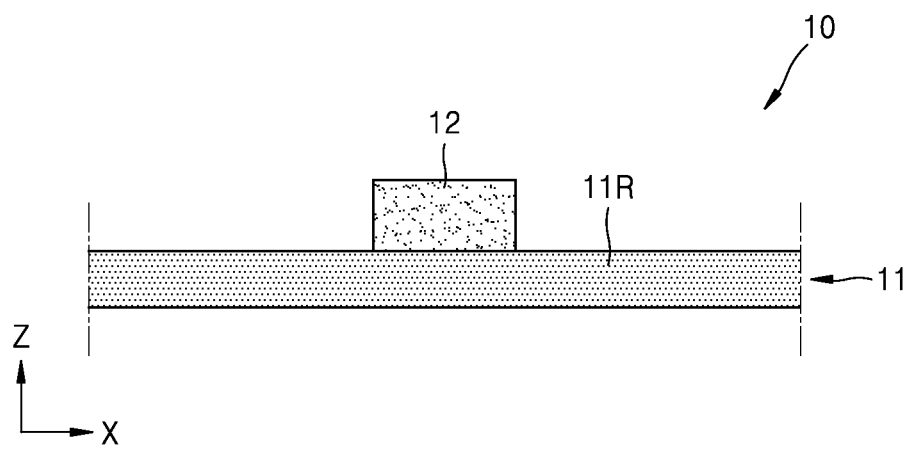
FIG. 4A through 4C are diagrams for describing a method of controlling a current path range related to the electronic element of FIG. 1.
Figure 4B:
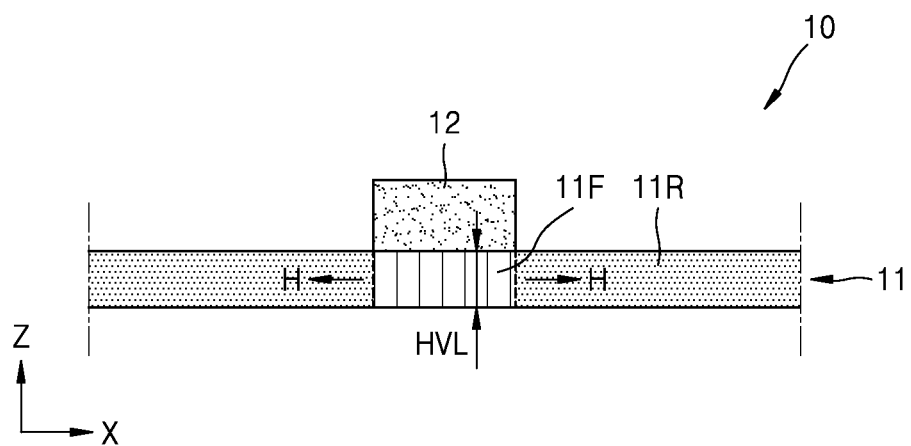
Figure 4C:
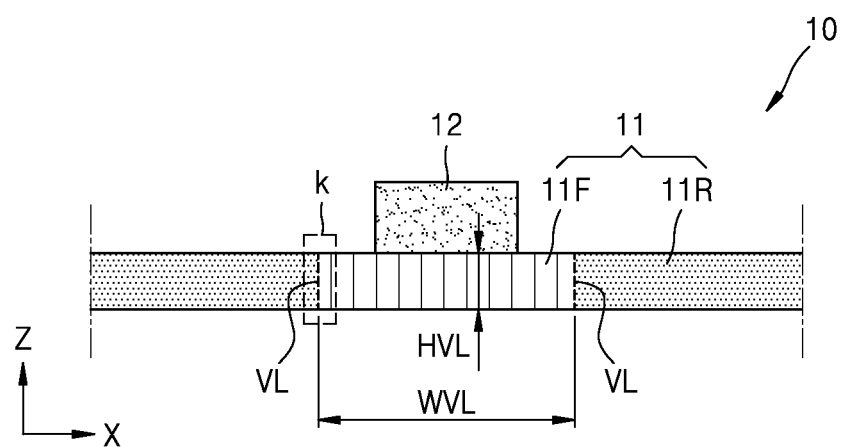

FIG. 4A through 4C are diagrams for describing a method of controlling a current path range related to the electronic element of FIG. 1.

Referring to FIG. 4A, the active layer 11 may include the first polarization region 11R having the first polarization direction. In some embodiments, an initialization electric field may be applied through the application electrode 12 to form a polarization state of the active layer 11, as illustrated in FIG. 4A.

Then, referring to FIG. 4B, the second polarization region 11F is formed in the active layer 11. For example, the second polarization region 11F may be preferentially formed in a region overlapping at least the application electrode 12 to correspond to a width of the application electrode 12.

An electric field that is larger than a coercive field of the active layer 11 and is large enough to form the height HVL of the second polarization region 11F to correspond to at least the total thickness of the active layer 11 may be applied to the active layer 11 through the application electrode 12.

By applying an electric field through the application electrode 12 described above, a polarization direction of a region of the first polarization region 11R of the active layer 11 may be changed to change the region to the second polarization region 11F.

In some embodiments, a growth rate of the second polarization region 11F in a direction of the height HVL may be very fast, for example, may be at a rate of about 1 km/sec.

Then, when the electric field through the application electrode 12 is continuously maintained, that is, when time passes, the second polarization region 11F may be move in a horizontal direction H, that is, in a direction orthogonal to the height HVL, and a size of the second polarization region 11F may be increased. That is, a region of the first polarization region 11R may be gradually converted into the second polarization region 11F.

In some embodiments, a growth rate of the second polarization region 11F in the horizontal direction H may be very fast, for example, at a rate of 1 m/sec.

Accordingly, a size of the variable low-resistance region VL may be controlled, and the size corresponds to, for example, the width WVL of the second polarization region 11F in a direction and a growth distance of the second polarization region 11F, and thus the size of the variable low-resistance region VL may be proportional to the growth rate of the second polarization region 11F? and a period of time that the electric field is maintained. For example, the growth distance of the second polarization region 11F may be proportional to a product of the growth rate thereof and the period of time that the electric field is maintained.

In addition, the growth rate of the second polarization region 11F may be proportional to a sum of the growth rate thereof in a direction of the height HVL and the growth rate thereof in the horizontal direction H.

Thus, the size of the variable low-resistance region VL may be adjusted as desired by controlling the period of time of maintaining the electric field.

In detail, as illustrated in FIG. 4C, the second polarization region 11F is widely spread to be extended, and accordingly, the variable low-resistance region VL may also be moved in a direction away from the application electrode 12.

In the present embodiment, an electric field may be applied to an active layer through an application electrode to form, in the active layer, a second polarization region having a second polarization direction different from a first polarization direction, and a variable low-resistance region corresponding to a boundary between a first polarization region and the second polarization region may be formed. The variable low-resistance region is a region having low-resistance, that is, a region having a reduced resistance, and may act as a path of a current, thereby allowing to easily form an electronic element.

In addition, according to the present embodiment, a height of a variable low-resistance region may be determined by controlling the magnitude of the electric field through the application electrode, for example, by controlling the magnitude of a voltage, and specifically, such that the height corresponds to a total thickness of the active layer.

Also, the size of the variable low-resistance region, for example, a width thereof, may be determined by controlling a period of time during which the electric field through the application electrode is maintained. By controlling the size of the variable low-resistance region, a size of a path of a current flow may be easily controlled.

Also, even when the electric field through the application electrode is removed, a polarization state of a polarization region is maintained, and thus, the path of current may be easily maintained, and when the polarization region is extended by continuously maintaining the electric field through the application electrode, a resistance of the variable low-resistance region that is already formed is reduced, thereby preventing a current from flowing.

Accordingly, extinction of the path of the current may be controlled, and as a result, the flow of the current may be easily controlled.

Figure 5:
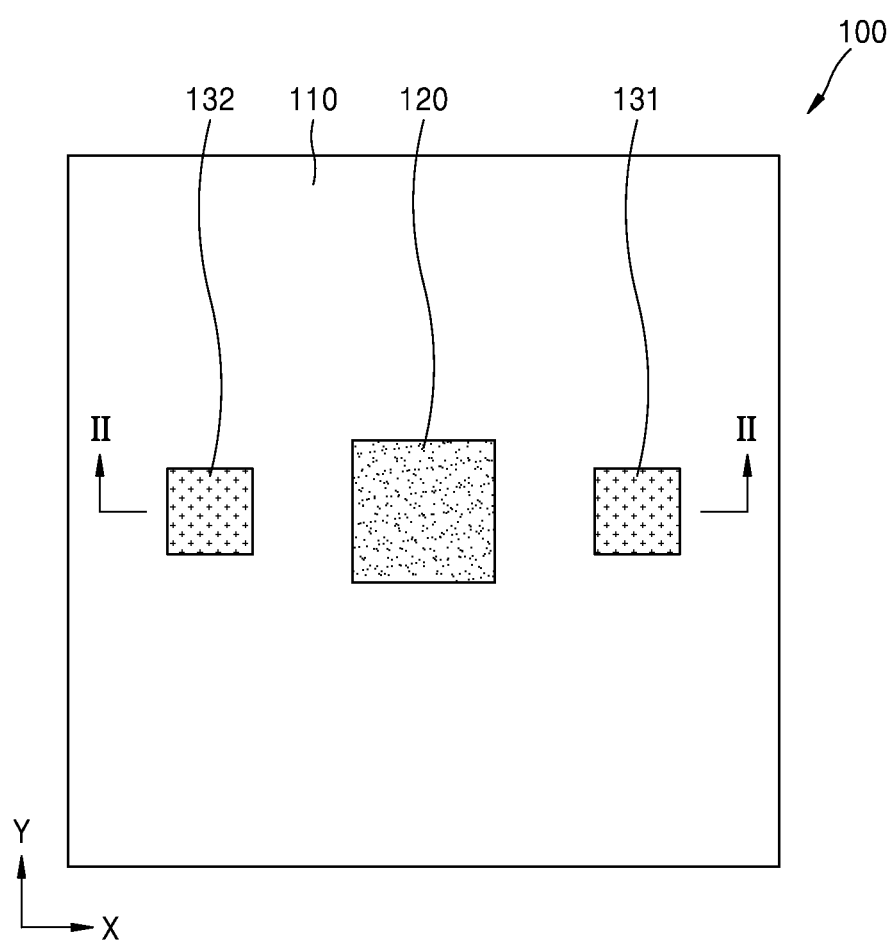
FIG. 5 is a schematic plan view illustrating an electronic element according to another embodiment of the present disclosure.
Figure 6:
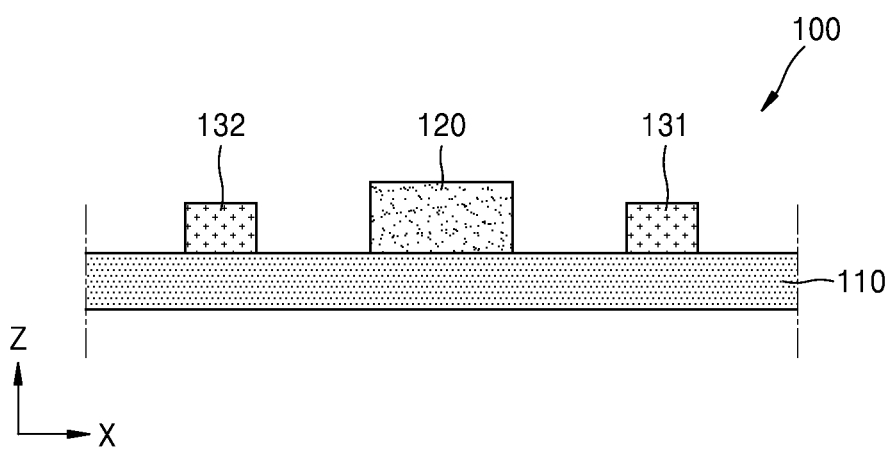
FIG. 6 is a cross-sectional view taken along line II-II of FIG. 5.

FIG. 5 is a schematic plan view illustrating an electronic element according to an embodiment of the present disclosure, and FIG. 6 is a cross-sectional view taken along line II-II of FIG. 5.

Referring to FIGS. 5 and 6, an electronic element 100 according to the present embodiment may include an active layer 110, an application electrode 120, a variable low-resistance region VL, and one or more connection electrode portions 131 and 132.

The active layer 110 may include a spontaneous polarizable material. For example, the active layer 110 may include an insulating material and a ferroelectric material. That is, the active layer 110 may include a material having a spontaneous electric polarization (electric dipole) that may be reversed in the presence of an electric field.

In some embodiments, the active layer 110 may include a perovskite-based material, for example, $BaTiO_3$, $SrTiO_3$, $BiFe_3$, $PbTiO_3$, $PbZrO_3$, $SrBi_2Ta_2O_9$.

As another example, the active layer 110 may have an ABX3 structure, in which A may include at least one material selected from an alkyl group of CnH2n+1 and an inorganic material such as Cs, Ru, or the like capable of forming a perovskite solar cell structure, B may include at least one material selected from among Pb, Sn, Ti, Nb, Zr, and Ce, and X may include a halogen material. In detail, the active layer 110 may include $CH_3NH_3PbI_3$, $CH_3NH_3PbI_xCl_{3-x}$, $MAPbI_3$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ ($0 \leq x, y \leq 1$).

As the active layer 110 may be formed using other various ferroelectric materials, description thereof will be omitted. In addition, when forming the active layer 110, an additional function may be included or an improvement in electrical characteristics may be added by doping a ferroelectric material with various other materials.

The active layer 110 may have spontaneous polarization, and may be used to control a degree and direction of the polarization according to application of an electric field. In addition, the active layer 110 may maintain a polarization state even when an applied electric field is removed.

The application electrode 120 may be formed to apply an electric field to the active layer 110, for example, to apply a voltage to the active layer 110.

In some embodiments, the application electrode 120 may be formed to contact an upper surface of the active layer 110.

In addition, the application electrode 120 may be formed to apply various magnitudes of voltage to the active layer 110 and to control a period of time for applying the voltage.

In some embodiments, the application electrode 120 may include a gate electrode. For example, the application electrode 120 may be electrically connected to a power supply (not shown) or a power controller.

The application electrode 120 may include various materials and may include a material having high electrical conductivity. For example, the application electrode 120 may be formed using various metals.

For example, the application electrode 120 may include aluminum, chromium, titanium, tantalum, molybdenum, tungsten, neodymium, scandium, or copper. Alternatively, the application electrode 120 may be formed using an alloy of the above materials or a nitride of the above materials.

In addition, in some embodiments, the application electrode 120 may include a stacked structure.

The connection electrode portions 131 and 132 may include one or more electrode members, for example, a first connection electrode member 131 and a second connection electrode member 132.

The connection electrode portions 131 and 132 may be formed on the active layer 110, for example, on an upper surface of the active layer 110 to be apart from the application electrode 120, and in some embodiments, the electrode connection electrode portions 131 and 132 may be formed to contact the active layer 110.

The first connection electrode member 131 and the second connection electrode member 132 may be formed using various conductive materials. For example, the first connection electrode member 131 and the second connection electrode member 132 may include aluminum, chromium, copper, tantalum, titanium, molybdenum, or tungsten.

In some embodiments, the first connection electrode member 131 and the second connection electrode member 132 may include a structure in which a plurality of conductive layers are stacked.

In some embodiments, the first connection electrode member 131 and the second connection electrode member 132 may be formed using a conductive metal oxide, and may include, for example, indium oxide (e.g., $In_2O_3$), tin oxide (e.g., $SnO_2$), zinc oxide (e.g., $ZnO$), an indium oxide tin alloy (e.g., $In_2O_3$—$SnO_2$), or an indium oxide zinc alloy (e.g., $In_2O_3$—$ZnO$).

In some embodiments, the connection electrode portions 131 and 132 may be terminal members including an input and an output of an electrical signal.

In addition, for example, the first connection electrode member 131 and the second connection electrode member 132 of the connection electrode portions 131 and 132 may include a source electrode or a drain electrode.

FIGS. 7 through 11 are diagrams for describing an operation of the electronic element 100 of FIG. 5.

Figure 7:
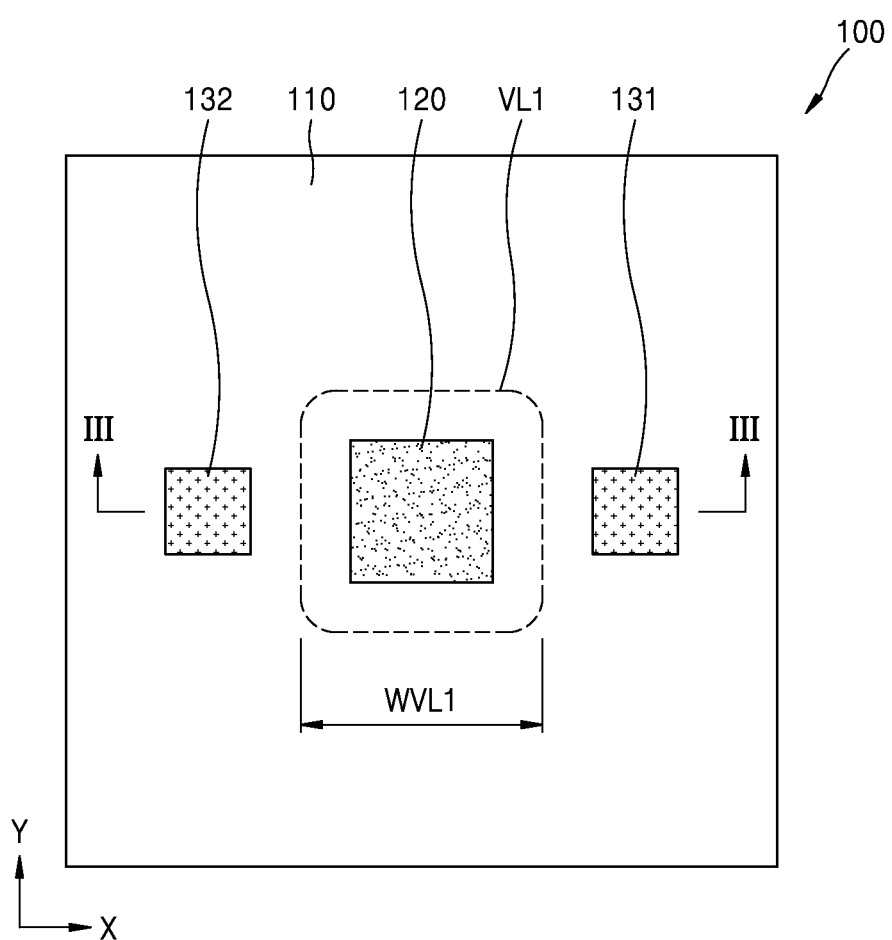
FIGS. 7 through 11 are diagrams for describing an operation of the electronic element of FIG. 5.
Figure 8:
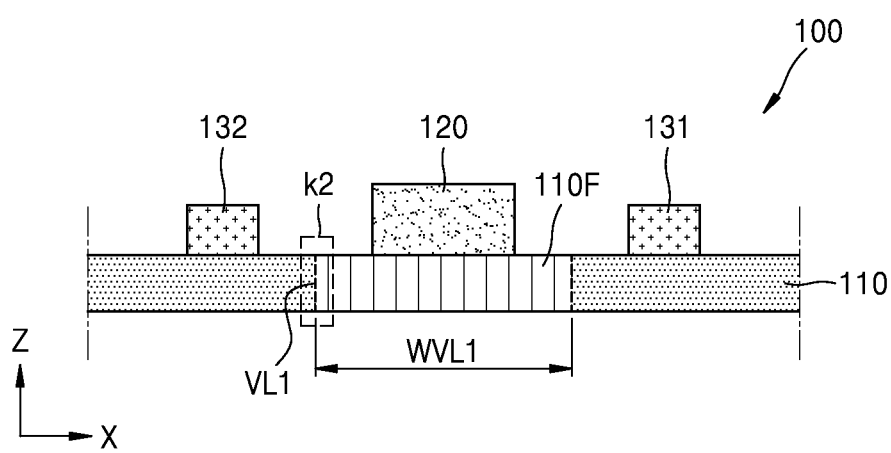
Figure 9:
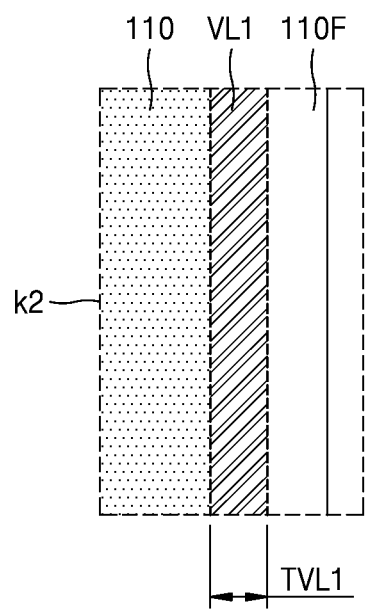

FIG. 7 is a diagram illustrating a state in which a first electric field is applied through the application electrode 120, FIG. 8 is a cross-sectional view taken along line III-III of FIG. 7, and FIG. 9 is an enlarged view of K2 of FIG. 8.

Referring to FIGS. 7 through 9, when the first electric field is applied to the active layer 110 through the application electrode 120, at least one region of the active layer 110 may include a polarization region 110F.

The polarization region 110F may have a shape surrounding the application electrode 120 with the application electrode 120 in a center. The polarization region 110F may have a boundary line.

A first variable low-resistance region VL1 may be formed in a region corresponding to a side surface of the boundary line of the polarization region 110F. Referring to FIG. 7, the first variable low-resistance region VL1 may be formed in a line shape surrounding the application electrode 120.

For example, first variable low-resistance regions VL1 facing each other may have a first width WVL1 in a direction to surround the application electrode 120.

In addition, the first variable low-resistance region VL1 may be formed to correspond to the entire side surface of the boundary line of the polarization region 110F, and may have a thickness TVL1 in a direction away from a side surface of the polarization region 110F, that is, in a plane direction.

In some embodiments, the thickness TVL1 may be +/−0.2 nm with respect to 0.3 nm.

In some embodiments, an operation of applying an initialization electric field to the active layer 110 may be performed before a first voltage is applied to the active layer 110 through the application electrode 120.

According to the operation of applying the initialization electric field to the active layer 110, an operation of converting a region of the active layer 110 into a polarization region in a direction different from that of the polarization region 110F, for example, a polarization region in an opposite direction, may be included.

Then, the polarization region 110F may be formed in a region of the active layer 110 by applying an electric field in the opposite direction.

The first variable low-resistance region VL1 formed at a boundary of the polarization region 110F of the active layer 110 may be changed into a region having a lower resistance than other regions of the active layer 110. For example, the first variable low-resistance region VL1 may have a lower resistance than the polarization region 110F of the active layer 110 and a region of the active layer 110 around the first variable low-resistance region VL1.

Accordingly, the first variable low-resistance region VL1 may form a path of current.

In some embodiments, the first variable low-resistance region VL1 may correspond to a region of a plurality of domain walls provided in the active layer 110.

In addition, the first variable low-resistance region VL1 may be continuously maintained when a polarization state of the polarization region 110F of the active layer 110 is maintained. That is, even when the first voltage applied to the active layer 110 through the application electrode 120 is removed, a state of the first variable low-resistance region VL1, that is a low-resistance state, may be maintained.

As illustrated in FIGS. 7 and 8, a path of current may be formed through the first variable low-resistance region VL1. However, as the connection electrode portions 131 and 132 do not correspond to the first variable low-resistance region VL1, a flow of a current through the connection electrode portions 131 and 132 may not occur.

Figure 10:
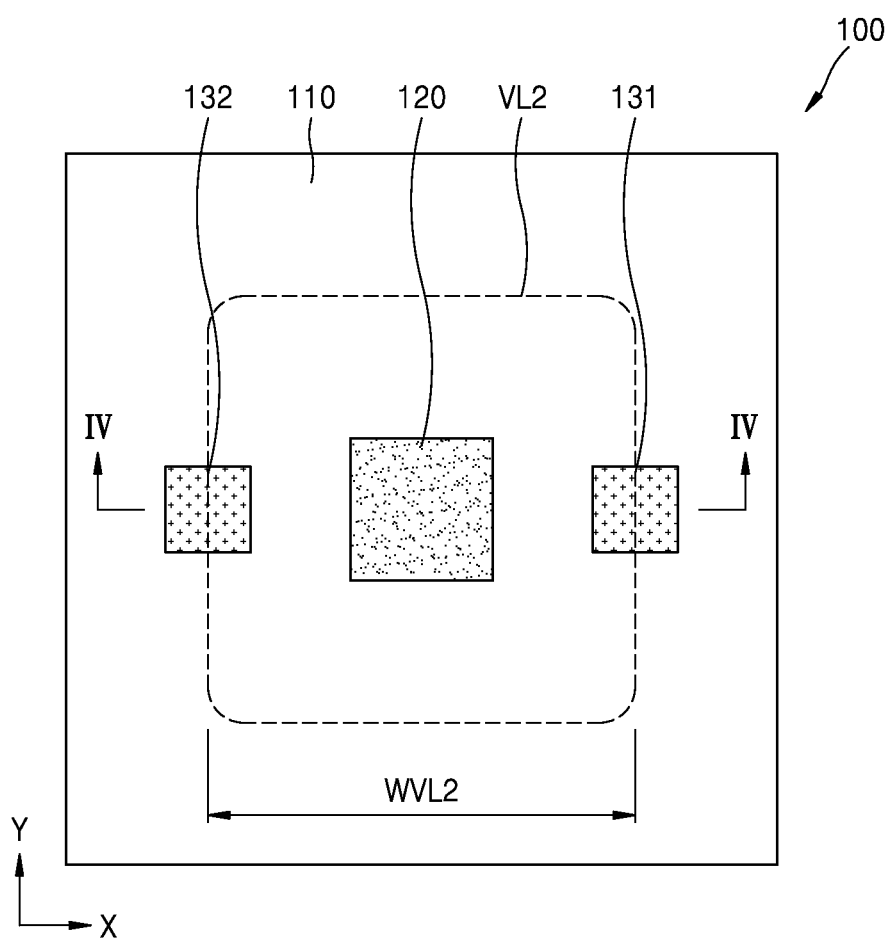
Figure 11:
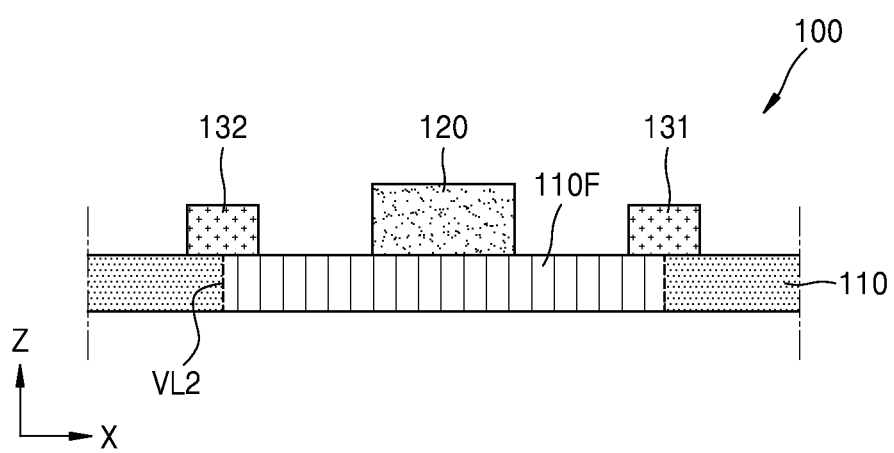

FIG. 10 is a diagram illustrating a state in which the first electric field is maintained for a predetermined period of time longer through the application electrode 120, and FIG. 11 is a cross-sectional view taken along line IV-IV of FIG. 10.

Referring to FIGS. 10 and 11, as the period of time during which the first electric field is maintained through the application electrode 120 extends, the polarization region 110F illustrated FIGS. 10 and 11 may be moved in a horizontal direction to extend the polarization region 110F, thereby forming a second variable low-resistance region VL2 that expands outwards compared to the first variable low-resistance region VL1.

For example, a structure as in FIGS. 10 and 11 may be formed by maintaining the voltage applied, described with reference to FIGS. 7 and 8, for a certain period of time longer.

The polarization region 110F may have a shape surrounding the application electrode 120. The polarization region 110F may have a boundary line. The second variable low-resistance region VL2 may be formed in a region corresponding to a side surface of the boundary line of the polarization region 110F. Referring to FIG. 10, the second variable low-resistance region VL2 may be formed in a line shape surrounding the application electrode 120 with the application electrode 120 in a center.

For example, a pair of second variable low-resistance regions VL2 facing each other may have a second width WVL2 in a direction, with the application electrode 120 therebetween, and the second width WVL2 may be greater than the first width WVL1.

In addition, the second variable low-resistance region VL2 may be formed to correspond to the entire side surface of the boundary line of the polarization region 110F, and may have a thickness in a direction away from the side surface of the polarization region 110F, and in some embodiments, the thickness may be +/−0.2 nm with respect to 0.3 nm.

The second variable low-resistance region VL2 formed at the boundary of the polarization region 110F of the active layer 110 may be changed into a region having a lower resistance than other regions of the active layer 110. For example, the second variable low-resistance region VL2 may have a lower resistance than the polarization region 110F of the active layer 110 and a region of the active layer 110 around the second variable low-resistance region VL2.

Accordingly, the second variable low-resistance region VL2 may form a path of a current.

In some embodiments, the second variable low-resistance region VL2 may correspond to a region of a plurality of domain walls provided in the active layer 110.

In addition, the second variable low-resistance region VL2 may be continuously maintained when a polarization state of the active layer 110 is maintained. That is, even when a second voltage applied to the active layer 110 through the application electrode 120 is removed, a state of the second variable low-resistance region VL2, that is, a low-resistance state, may be maintained.

Accordingly, a path of a current may be formed through the second variable low-resistance region VL2.

In addition, for example, the connection electrode portions 131 and 132 may be formed to correspond to the second variable low-resistance region VL2, and for example, the first connection electrode member 131 and the second connection electrode member 132 of the connection electrode portions 131 and 132 may be arranged to be apart from each other and contact an upper surface of the second variable low-resistance region VL2.

Accordingly, a current may flow through the first connection electrode member 131 and the second connection electrode member 132 of the connection electrode portions 131 and 132.

In addition, in some embodiments, an initialization operation on the entire active layer 110 may be performed.

Then, when an electric field is applied again to the active layer 110 through the application electrode 120, a current may flow through the first connection electrode member 131 and the second connection electrode member 132 of the connection electrode portions 131 and 132.

According to the electronic element according to the present embodiment, various magnitudes of voltages may be applied to the active layer through the application electrode, and a period of time for applying the voltages may be controlled.

Accordingly, a polarization region of a desired size may be formed in the active layer, and a variable low-resistance region may be formed at a boundary of the polarization region.

When a connection electrode portion is formed to correspond to the variable low-resistance region, for example, to contact the variable low-resistance region, a current may flow through the connection electrode portion, and even when the voltage is removed, the active layer including a ferroelectric material may maintain a polarization state, and thus, the variable low-resistance region at the boundary may be maintained and that the current may continuously flow.

In addition, a voltage may be applied to the active layer through the application electrode such that the variable low-resistance region is converted into a polarization region, and thus, a current does not flow anymore through the connection electrode portion, through which the current flowed previously.

The flow of the current may be controlled by controlling the voltage of the application electrode, and the electronic element may be used for various purposes by controlling the flow of the current.

In some embodiments, the electronic element may be used as a memory.

For example, the electronic element may be used as a memory by defining a flow of a current as 1 and no flow of current as 0; in detail, a current may also flow even when a voltage is removed, and thus, the electronic element may also be used as a non-volatile memory.

In addition, the electronic element may constitute a circuit unit that generates and transmits various signals, and may also be used as a switching element.

In addition, the electronic element according to the present disclosure has a simple structure that may be applied to a portion requiring control of an electrical signal, and may be applied to various fields such as a variable circuit, a CPU, a biochip, and the like.

Figure 12:
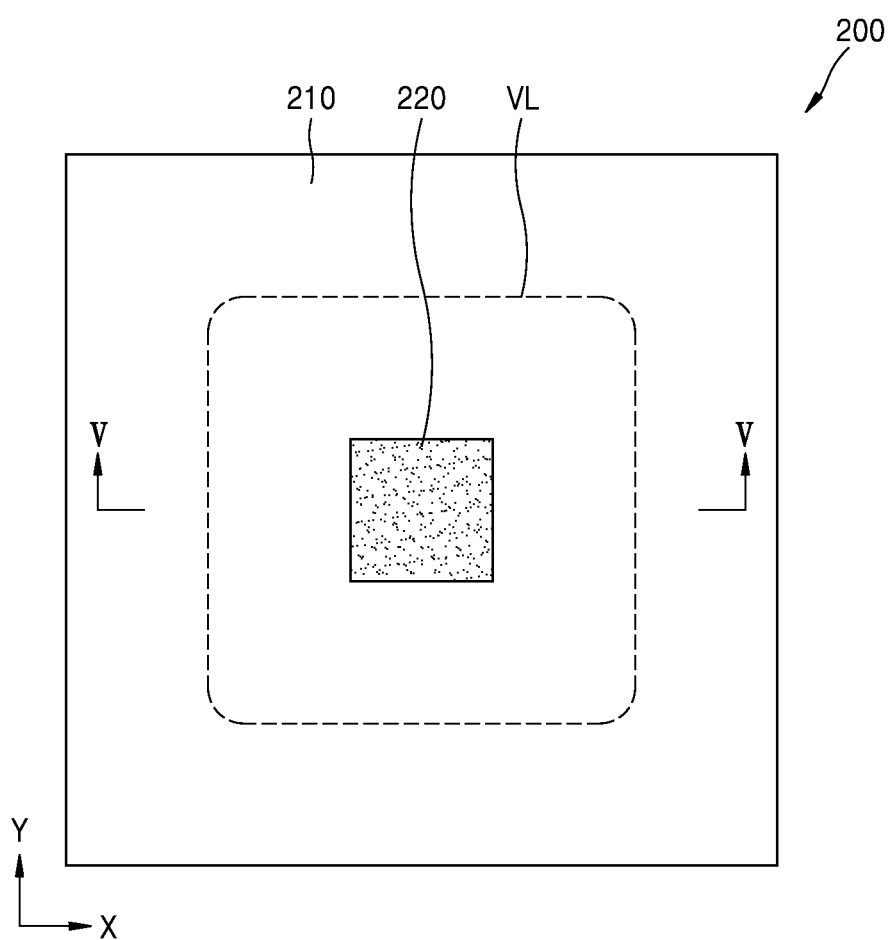
FIG. 12 is a schematic plan view illustrating an electronic element according to another embodiment of the present disclosure.
Figure 13:
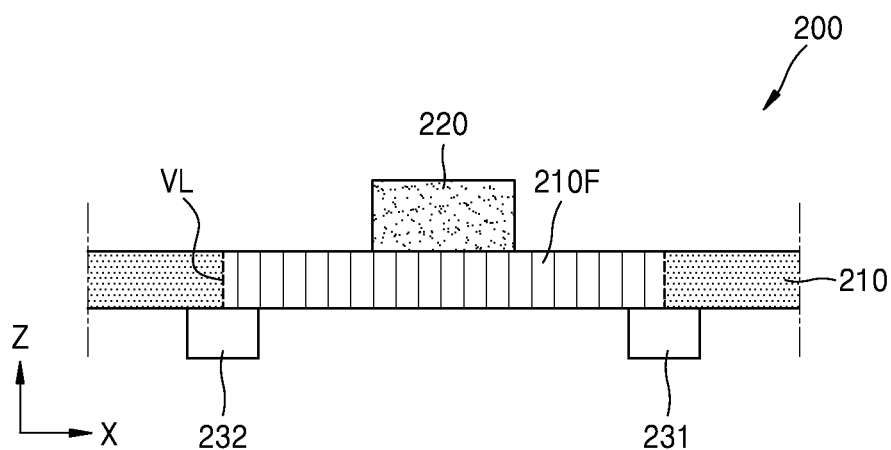
FIG. 13 is a cross-sectional view taken along line V-V of FIG. 12.

FIG. 12 is a schematic plan view illustrating an electronic element according to another embodiment of the present disclosure, and FIG. 13 is a cross-sectional view taken along line V-V of FIG. 12.

Referring to FIGS. 12 and 13, an electronic element 200 according to the present embodiment may include an active layer 210, an application electrode 220, a variable low-resistance region VL, and connection electrode portions 231 and 232.

For convenience of description, description will focus on differences from the previous embodiments.

The active layer 210 may include a spontaneous polarizable material. For example, the active layer 210 may include an insulating material and a ferroelectric material. That is, the active layer 210 may include a material having a spontaneous electrical polarization (electric dipole) that may be reversed in the presence of an electric field.

Description of the material for forming the active layer 210 is the same as that described in the above-described embodiments or materials modified from the above-described ones may be used, and thus, detailed description thereof will be omitted.

The application electrode 220 may be formed to apply an electric field to the active layer 210, for example, to apply a voltage to the active layer 210.

In some embodiments, the application electrode 220 may be formed to contact an upper surface of the active layer 210.

Description of the material for forming the application electrode 220 is the same as that described in the above-described embodiments or materials modified from the above-described ones may be used, and thus, detailed description thereof will be omitted.

The connection electrode portions 231 and 232 may include one or more electrode members, for example, a first connection electrode member 231 and a second connection electrode member 232.

The connection electrode portions 231 and 232 may be formed on the active layer 210, for example, may be formed on a surface of the active layer 210 opposite to a surface thereof on which the application electrode 220 is formed, such that they are apart from the application electrode 220.

The application electrode 220 may be formed on the upper surface of the active layer 210, and the connection electrode portions 231 and 232 may be formed on a lower surface of the active layer 210.

In some embodiments, the application electrode 220 may be formed to contact the active layer 210.

The first connection electrode member 231 and the second connection electrode member 232 may be formed using various conductive materials.

Description of a material for forming the first connection electrode member 231 and the second connection electrode member 232 is the same as that described in the above-described embodiment, or materials modified from the above-described ones may be used, and thus, detailed description thereof will be omitted.

Referring to FIG. 13, when a voltage is applied to the active layer 210 through the application electrode 220, at least one region of the active layer 210 may include a polarization region 210F.

The variable low-resistance region VL may be formed in a region corresponding to a side surface of a boundary line of the polarization region 210F, and referring to FIG. 12, the variable low-resistance region VL may be formed in a line shape surrounding the application electrode 220 with the application electrode 220 in a center.

In addition, the variable low-resistance region VL may be formed to correspond to the entire side surface of the boundary line of the polarization region 210F, and may have a thickness in a direction away from the side surface of the polarization region 210F, and in some embodiments, the thickness may be +/−0.2 nm with respect to 0.3 nm.

The variable low-resistance region VL formed at a boundary of the polarization region 210F of the active layer 210 may be changed into a region having a lower resistance than other regions of the active layer 210. For example, the variable low-resistance region VL may have a lower resistance than the polarization region 210F of the active layer 210 and a region of the active layer 210 around the variable low-resistance region VL.

Accordingly, the variable low-resistance region VL may form a path of a current. In some embodiments, the variable low-resistance region VL may correspond to a region of a plurality of domain walls provided in the active layer 210.

In addition, the variable low-resistance region VL may be continuously maintained when a polarization state of the active layer 210 is maintained. That is, even when a voltage applied to the active layer 210 through the application electrode 220 is removed, a state of the variable low-resistance region VL, that is, a low-resistance state, may be maintained.

Therefore, a path of a current may be formed through the variable low-resistance region VL.

In addition, for example, the connection electrode portions 231 and 232 may be formed to correspond to the variable low-resistance region VL, and for example, the first connection electrode member 231 and the second connection electrode member 232 of the connection electrode portions 231 and 232 may be arranged to be apart from each other and to contact a lower surface of the variable low-resistance region VL.

Accordingly, a current may flow through the first connection electrode member 231 and the second connection electrode member 232 of the connection electrode portions 231 and 232.

According to the electronic element of the present embodiment, various magnitudes of voltages may be applied to the active layer through the application electrode, and a period of time for applying the voltages may be controlled.

Accordingly, a polarization region of a desired size may be formed in the active layer, and a variable low-resistance region may be formed at a boundary of the polarization region.

In addition, the application electrode may be formed on one surface of the active layer, and the connection electrode portion may be formed on the other surface of the active layer, thereby easily forming precise micro-patterns of the electronic element.

The above-described electronic element may be implemented as a variable low-resistance line memory device as below.

Figure 14:
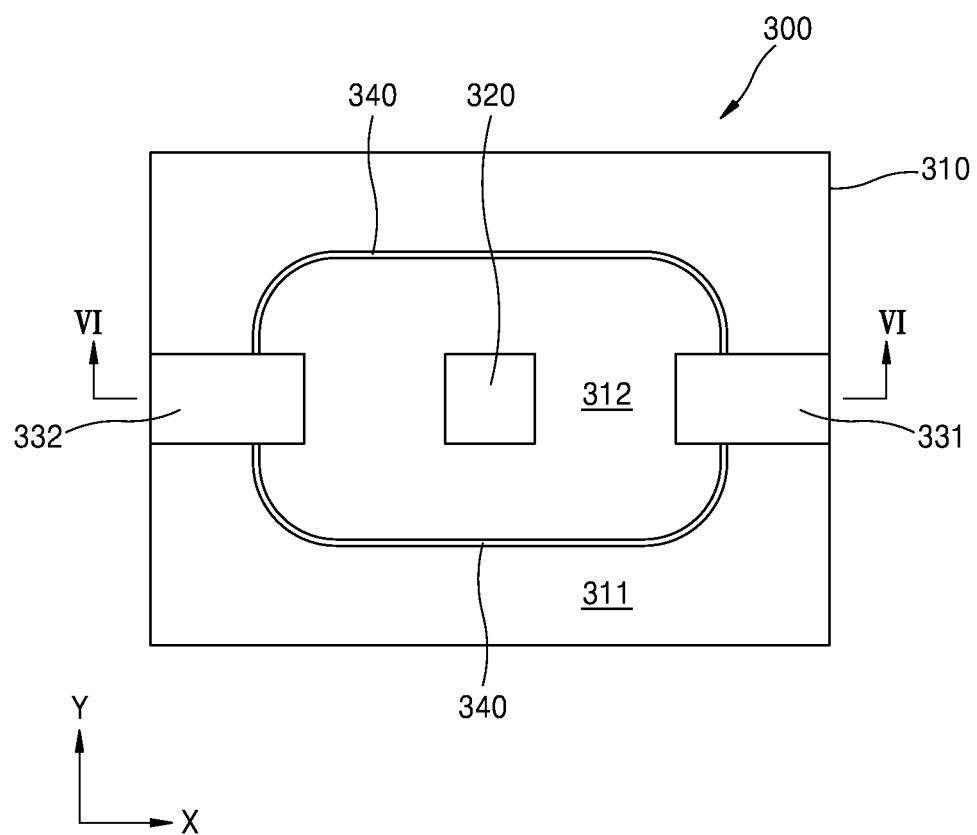
FIG. 14 is a schematic plan view illustrating a memory device according to another embodiment of the present disclosure.
Figure 15:
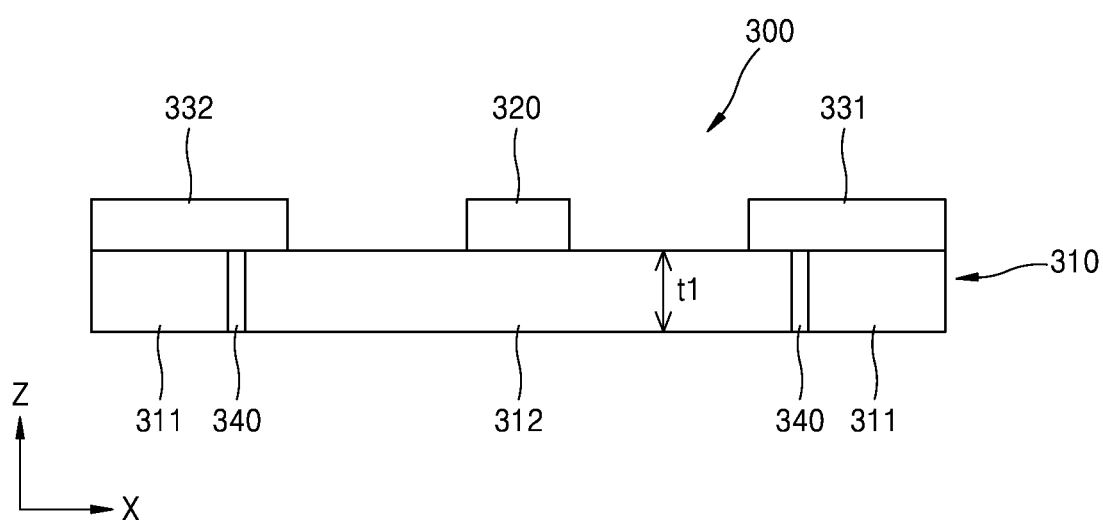
FIG. 15 is a cross-sectional view taken along line VI-VI of FIG. 14.

FIG. 14 is a plan view of a variable low-resistance line memory device 300 according to an embodiment, and FIG. 15 is a cross-sectional view taken along line VI-VI of FIG. 14.

Referring to FIGS. 14 and 15, the variable low-resistance line memory device 300 may include a base 310, a gate 320, a source 331, and a drain 332.

The base 310 may include the material of the active layer described above, for example, a spontaneous polarizable material. For example, the base 310 may include an insulating material and a ferroelectric material. That is, the base 310 may include a material having a spontaneous electrical polarization (electrical dipole) that may be reversed in the presence of an electric field.

In some embodiments, the base 310 may include a perovskite-based material, for example, $BaTiO_3$, $SrTiO_3$, $BiFe_3$, $PbTiO_3$, $PbZrO_3$, $SrBi_2Ta_2O_9$.

As another example, the base 310 may have an ABX3 structure, in which A may include at least one material selected from an alkyl group of CnH2n+1 and an inorganic material such as Cs, Ru, or the like capable of forming a perovskite solar cell structure, B may include at least one material selected from among Pb, Sn, Ti, Nb, Zr, and Ce, and X may include a halogen material. In detail, the base 310 may include $CH_3NH_3PbI_3$, $CH_3NH_3PbI_xCl_{3-x}$, $MAPbI_3$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ ($0 \leq x, y \leq 1$).

As the base 310 may be formed using other various ferroelectric materials, description thereof will be omitted. In addition, when forming the base 310, an additional function may be included or an improvement in electrical characteristics may be added by doping a ferroelectric material with various other materials.

The base 310 may have spontaneous polarization, and may be used to control a degree and direction of the polarization according to application of an electric field. In addition, the base 310 may maintain a polarization state even when an applied electric field is removed.

The base 310 may include a first region 311 and a second region 312 that are adjacent to each other in an X-Y plane direction. The first region 311 may have a polarization in a first direction, and the first direction may be a Z-direction perpendicular to a thickness direction of the base 310, that is, a direction in which the first region 311 and the second region 312 are arranged.

The second region 312 is located adjacent to the first region 311 in a direction perpendicular to a thickness of the base 310, that is, in the X-Y plane direction, and the second region 312 may selectively have a polarization aligned in a second direction opposite to the first direction.

A gate 320 may be located on the second region 312. Although not shown, the gate 320 may be connected to an additional device (not shown) to receive a gate signal.

The polarization realized in the second region 312 in a direction opposite to that of the first region 311 may be achieved by a voltage applied to the gate 320.

A variable low-resistance line 340 may be formed between the first region 311 and the second region 312 having polarization in opposite directions as described above. The variable low-resistance line 340 may be a region having a very low resistance compared to the first region 311 and/or the second region 312, and a flow of a current may be formed through the above region.

The variable low-resistance line 340 may be formed according to an embodiment described below.

First, the base 310 including a spontaneous polarizable material may have a polarization in the first direction overall. Not the entire base 310 necessarily has the polarization in the first direction, and a certain area of the base 310 facing at least the gate 320 may have the polarization in the first direction. The base 310 or a region thereof selectively having the polarization in the first direction may be formed by applying an initialization electric field to the gate 320.

In this state, as an electric field is applied to the base 310 through the gate 320 by applying a first voltage to the gate 320 for a first period of time, a polarization of a certain region opposite to the gate 320 is changed into a second direction. The electric field applied to the gate 320 to change a direction of the polarization may be controlled using the first voltage, that is, the first voltage may be applied to apply an electric field that is greater than a coercive field of the spontaneous polarizable material that forms the base 310.

The base 310 may have a first thickness t1. In this case, the second region 312 may be formed throughout the first thickness t1, and the magnitude of the first voltage applied to the gate 320 may be adjusted according to the first thickness t1. According to an embodiment, the first thickness t1 may be proportional to the magnitude of the first voltage applied to the gate 320. That is, when the first thickness t1 is thick, the first voltage may be increased.

As illustrated in FIG. 15, the variable low-resistance line 340 may be formed over the entire first thickness t1.

An area of the second region 312 formed as described above may be determined proportionally to the first period of time during which the first voltage is applied to the gate 320.

Therefore, in order to form the second region 312 having a desired area and/or size, an appropriate gate voltage, period of time, and the first thickness t1 of the second region 312 for a relevant ferroelectric material may be determined in advance by experiments and/or calculations.

When a polarization direction of the second region 312 is changed from the first direction to the second direction, the variable low-resistance line 340 having a certain width may be formed between the first region 311 having the polarization in the first direction and the second region 312 having the polarization in the second direction. The variable low-resistance line 340 may be formed around the gate 320. The variable low-resistance line 340 may have a width of about 0.3 nm, but is not limited thereto, and may have a width of +/−0.2 nm with respect to 0.3 nm.

Figure 16:
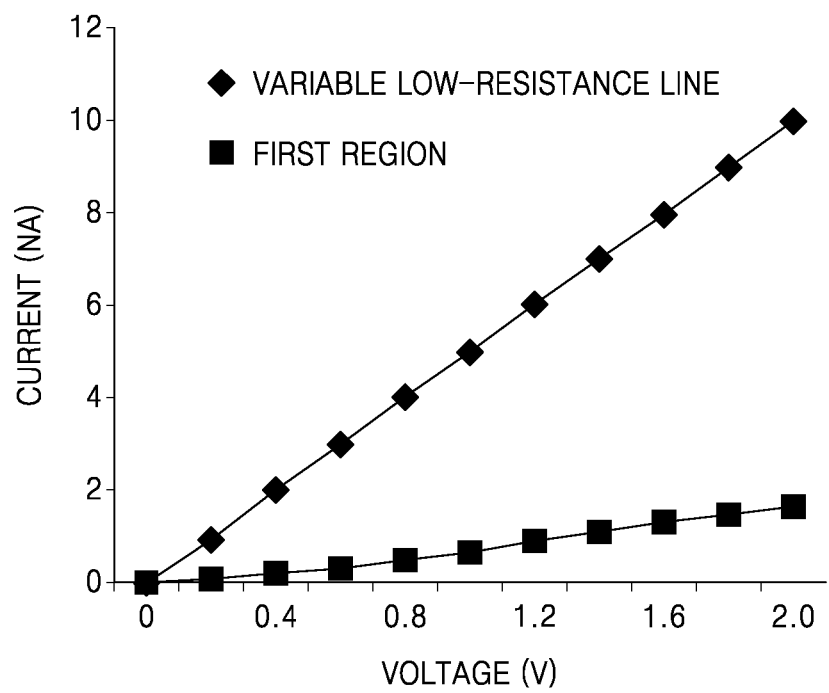
FIG. 16 is a graph showing a relationship between a voltage and current of a first region and of a variable low-resistance line.

FIG. 16 illustrates a state in which a current changes as a voltage increases in the first region 311 and the variable low-resistance line 340. As the variable low-resistance line 340 has a significantly lower resistance than the first region 311, it can be seen that a smooth flow of current is generated according to the application of a voltage.

The variable low-resistance line 340 formed as described above may not be erased even when time passes.

The source 331 and the drain 332 are located to contact the variable low-resistance line 340. In this case, a current may flow from the source 331 to the drain 332 through the variable low-resistance line 340. Thus, data may be written here, and for example, the data may be read as 1.

Selectively, the polarization direction of the second region 312 may be changed to be the same as the polarization direction of the first region 311 by a voltage applied to the variable low-resistance line 340 and the gate 320.

That is, the polarization direction of the second region 312 may be set to the first direction again by applying a second voltage to the gate 320. Thereafter, the second voltage may be maintained for a second period of time to grow, in a plane direction, a region, polarization of which is changed to the first direction, and when the region having the polarization changed to the first direction passes by the variable low-resistance line 340 and extends to the first region 311, the variable low-resistance line 340 may be disappeared. In this case, a current may not flow from the source 331 to the drain 332, and thus, data may be erased here and may be read as 0.

In this case, the second voltage may be a voltage different from the first voltage, and may be a voltage having a same magnitude as the first voltage and an opposite polarity to that of the first voltage. The second period of time may be at least the first period of time or longer.

The variable low-resistance line memory device 300 formed as described above may be used as a non-volatile memory device as the variable low-resistance line 340 is able to maintain its state even when power is turned off in the gate 320.

Data may be written or erased to or from the variable low-resistance line memory device about $10^{12}$ times or more, and thus, the variable low-resistance line memory device may have a memory lifespan of about $10^7$ times or more as compared with a conventional semiconductor device-based memory device.

The variable low-resistance line memory device may have a memory speed of about $10^{-9}$ sec, which may increase a memory speed by about $10^6$ times compared to the conventional semiconductor device-based memory device.

As described above, the variable low-resistance line memory device may have an excellent speed and lifetime.

A conventional ferroelectric memory uses polarization of a ferroelectric material, and thus, there are limitations in reducing a size of a ferroelectric element. However, as only the characteristics of a low-resistance line are used in the variable low-resistance line memory device without directly using polarization, an integration degree thereof may be further increased.

In addition, a position at which the variable low-resistance line 340 is formed may be adjusted according to a gate voltage and/or an application time, and thus, various memory devices may be designed, and a relatively thin memory device compared to conventional ferroelectric memory devices using a ferroelectric material may be formed. Furthermore, as the degree of freedom of memory design is increased, the degree of integration of devices may be increased.

As illustrated in FIG. 14, the variable low-resistance line 340 formed as described above may be formed in a closed loop shape around the gate 320, and two lines may be connecting the source 331 to the drain 332 as the source 331 and the drain 332 are arranged in a portion of the closed loop shape. However, the present disclosure is not limited thereto, and when a gate is positioned at one side of the base in a plane direction and the source and the drain are arranged at two other adjacent sides, the variable low-resistance line may be a single line connecting the source and the drain to each other.

The source 331 and the drain 332 may have an electrode structure formed by patterning on the base 310, but the present disclosure is not limited thereto, and although not illustrated in the drawings, the source and the drain may be in contact with the variable low-resistance line 340 through a via hole formed in an insulating layer covering the base 310.

Figure 17:
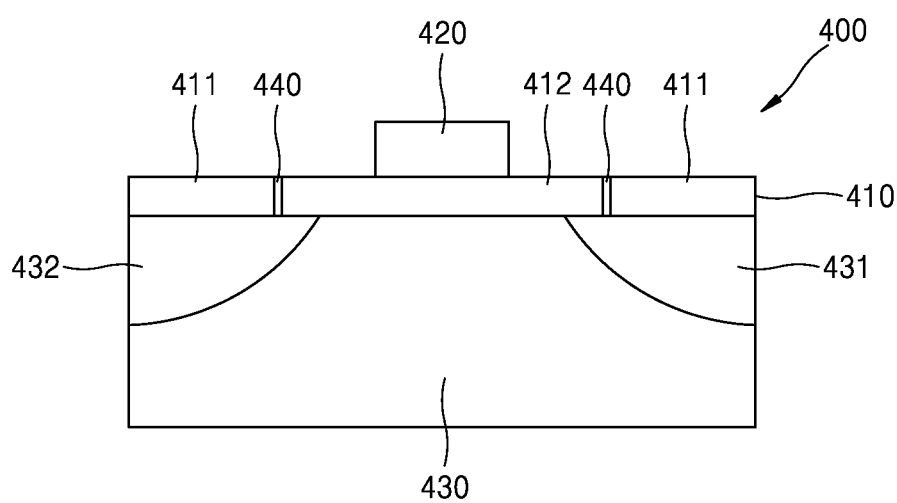
FIG. 17 is a cross-sectional view of a variable low-resistance line memory device according to another embodiment.

FIG. 17 is a cross-sectional view of a variable low-resistance line memory device 400 according to another embodiment, in which a source 431 and a drain 432 may be formed in a substrate 430, and a base 410 including a spontaneous polarizable material may be arranged on the substrate 430. The substrate 430 may include a semiconductor wafer, for example, a silicon wafer. The source 431 and the drain 432 may be formed by ion-doping a wafer. Although not shown, an external signal line may be connected to the source 431 and the drain 432 through an additional via.

In this structure, a gate voltage and an application time thereof may be determined such that a variable low-resistance line 440 may be positioned to correspond to regions of the source 431 and the drain 432 formed in the substrate 430.

The substrate 430 and the base 410 as described above may be bonded using a separate adhesive layer, but the present disclosure is not limited thereto, and the base 410 may be formed on the substrate 430. By implementing the base 410 as a thin film on the substrate 430, the memory device 400 may have a thinner thickness, and an existing memory device process may be used, thereby further increasing the efficiency of the manufacturing process.

Figure 18:
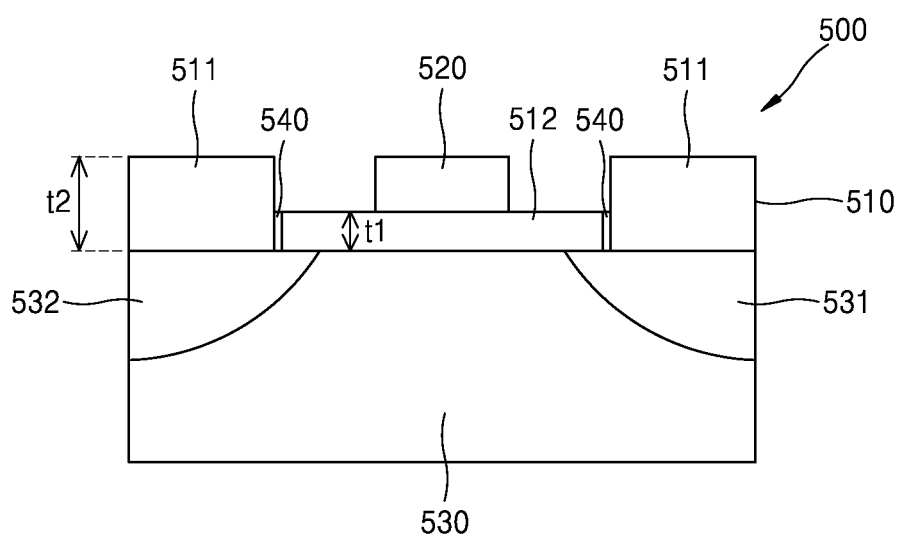
FIG. 18 is a cross-sectional view of a variable low-resistance line memory device according to another embodiment.

Although the above-described embodiments show a case in which the first region and the second region have the same thickness, the present disclosure is not limited thereto. FIG. 18 is a cross-sectional view of a variable low-resistance line memory device 500 according to another embodiment, in which a source 531 and a drain 532 may be formed in a substrate 530, and a base 510 including a spontaneous polarizable material may be arranged on the substrate 530. In the memory device 500 according to the embodiment illustrated in FIG. 18, a first region 511 may have a second thickness t2 that is greater than a first thickness t1 of a second region 512. The second thickness t2 may be a thickness at which a polarization direction is not switched by a voltage applied to a gate 520, and thus a variable low-resistance line 540 may be formed at a position corresponding to a boundary between the first thickness t1 and the second thickness t2.

As described above, as a voltage applied to the gate 520 may be set to a voltage at which polarization switching is performed with respect to the first thickness t1, by forming a region having the second thickness t2 in the base 510, the variable low-resistance line 540 may not be formed in the region having the second thickness t2 even by an intensity of the voltage applied to the gate 520 or a period of time for applying the voltage, and the variable low-resistance line 540 may be formed only in a region having the first thickness t1.

That is, as illustrated in FIG. 18, the variable low-resistance line 540 may be formed at a position that is a boundary between the first thickness t1 and the second thickness t2.

Figure 19:
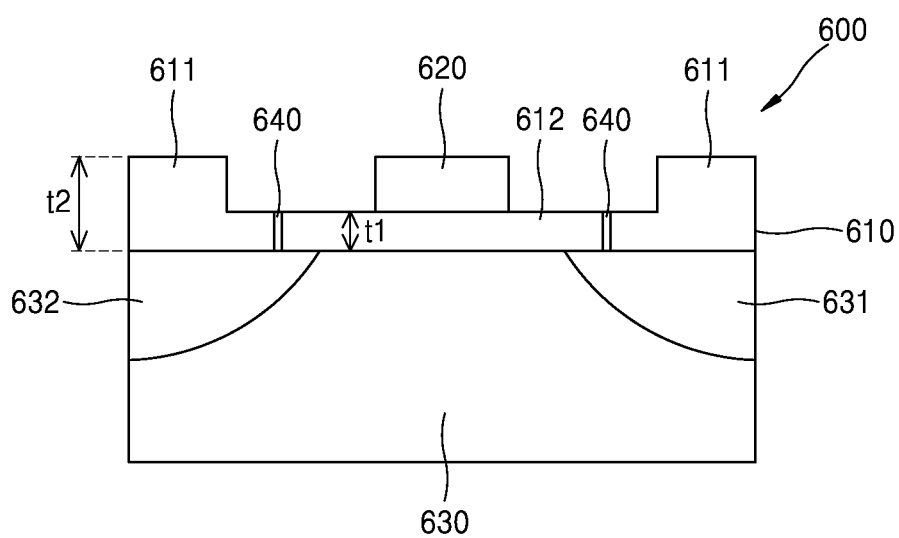
FIG. 19 is a cross-sectional view of a variable low-resistance line memory device according to another embodiment.

FIG. 19 is a cross-sectional view of a variable low-resistance line memory device 600 according to another embodiment, in which a source 631 and a drain 632 may be formed in a substrate 630, and a base 610 including a spontaneous polarizable material may be arranged on the substrate 630. In the memory device 60 according to the embodiment illustrated in FIG. 19, like the embodiment illustrated in FIG. 18, a first region 611 may have a second thickness t2 that is greater than a first thickness t1 of a second region 612.

In this case, according to a period of time during which a voltage is applied to a gate 620, as illustrated in FIG. 19, the gate 620 may be located at an inner side where a region having the first thickness t1 is formed from a boundary between the first thickness t1 and the second thickness t2. Accordingly, in the memory device 600 having the above-described structure, the source 631 and the drain 632 may be formed inward relative to the boundary between the first thickness t1 and the second thickness t2. Accordingly, although a position where the variable low-resistance line 640 is formed is changed according to a change in the intensity of the voltage of the gate 620 and/or the time of applying the voltage, the variable low-resistance line 640 may be electrically connected to the source 631/the drain 632.

Figure 20:
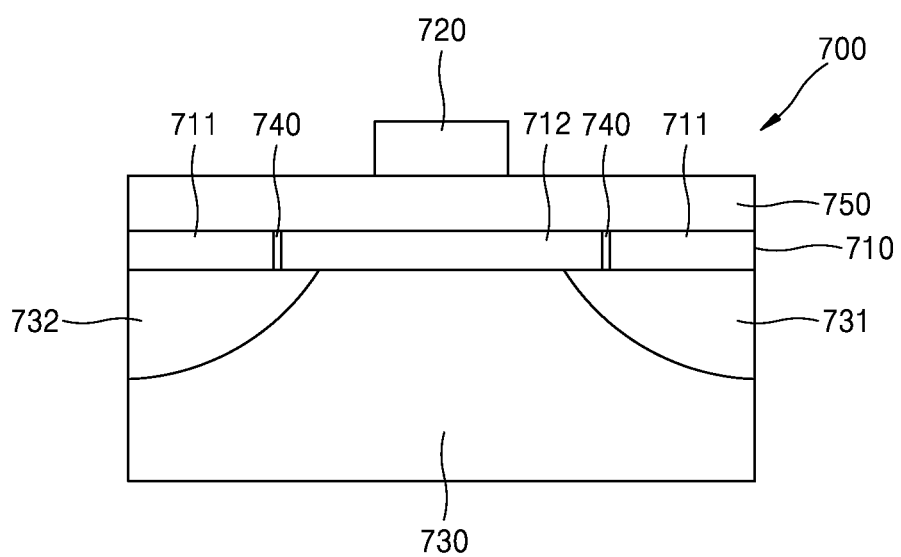
FIG. 20 is a cross-sectional view of a variable low-resistance line memory device according to another embodiment.

Although the gate is formed adjacent to the base, that is, on the base, in the above-described embodiments, the present disclosure is not limited thereto, and like in a memory device 700 according to another embodiment of the present disclosure, illustrated in FIG. 20 another layer 750 may be further positioned between a base 710 and a gate 720. The layer 750 may be an insulating layer, and may be a material different from a ferroelectric material forming the base 710.

Also, in this case, a polarization direction of a second region 712 may be switched due to the influence of an electric field generated by a voltage applied to the gate 720, and here, a voltage and/or time of the gate 720, at which the polarization direction may be switched may be obtained in advance through experiments and/or calculations.

Figure 21:
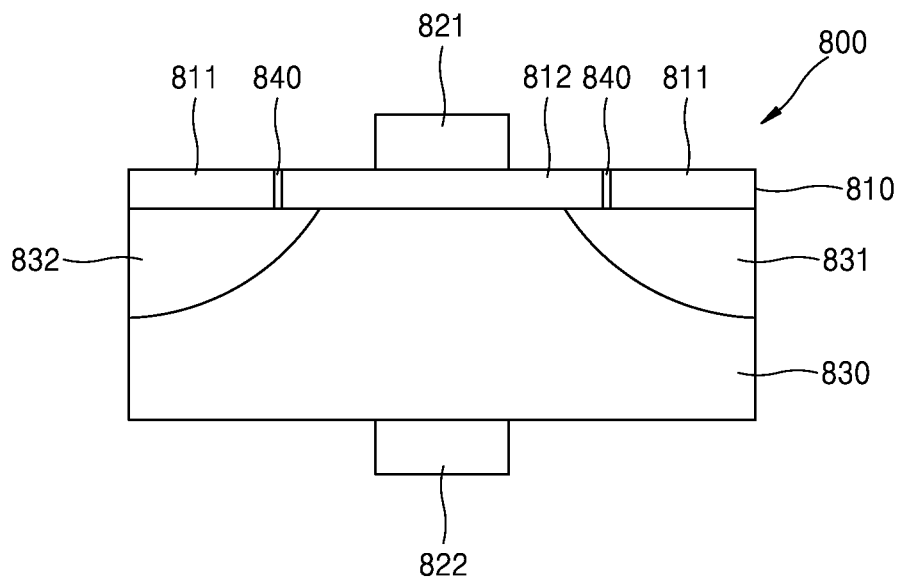
FIG. 21 is a cross-sectional view of a variable low-resistance line memory device according to another embodiment.

FIG. 21 is a cross-sectional view of a variable low-resistance line memory device 800 according to another embodiment, in which a source 831 and a drain 832 may be formed in a substrate 830, and a base 810 including a spontaneous polarizable material may be arranged on the substrate 830.

According to the embodiment illustrated in FIG. 21, a first gate 821 facing the base 810 and a second gate 822 positioned opposite to the first gate 821 with respect to the base 810 may be included.

In this case, a variable low-resistance line 840 may be formed by switching a polarization direction of the second region 812 by using the first gate 821. Accordingly, data may be written.

The variable low-resistance line 840 may be removed by switching the polarization direction of the second region 812 again like the first region 811 by using the second gate 822. Accordingly, data may be erased.

As described above, data may be read as 0/or 1 by using the first gate 821 and the second gate 822.

All embodiments of the present specification described above are not limited to the illustrated ones and may be applied in combination with each other.

As described above, the present disclosure is described with reference to the embodiments shown in the drawings, but this is merely exemplary, and it will be understood by those of ordinary skill in the art that various changes and other equivalent embodiments may be made therein. Therefore, the true technical scope of the present disclosure should be determined by the technical spirit of the appended claims.

The particular implementations shown and described herein are illustrative examples of the present disclosure and are not intended to otherwise limit the scope of the present disclosure in any way. Moreover, no item or component is essential to the practice of the present disclosure unless the element is specifically described as "essential" or "critical".

The use of the terms "a" and "an" and "the" and similar referents in the context of describing the present disclosure (especially in the context of the following claims) are to be construed to cover both the singular and the plural. Furthermore, recitation of ranges of values herein is merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. Embodiments are not limited to the described order of the above steps. The use of any and all examples, or exemplary language (e.g., "such as") provided herein, is intended merely to better illuminate the present disclosure and does not pose a limitation on the scope of the present disclosure unless otherwise claimed. Numerous modifications, combinations, and adaptations according to design conditions and factors will be readily apparent to those skilled in this art without departing from the spirit and scope of the present disclosure.

INDUSTRIAL APPLICABILITY

All embodiments of the present specification described above are not limited to the illustrated ones, and may be applied in combination with each other.

The invention claimed is:

1. A non-volatile memory device comprising:
   a base comprising a spontaneous polarizable material;
   a gate arranged adjacent to a surface of the base;
   at least two polarization regions formed in the base by applying an electric field to the base through the gate, the at least two polarization regions having polarization in different directions from each other;
   a variable low-resistance line corresponding to a boundary between the at least two polarization regions selectively having polarization in different directions from each other;
   a source located to contact the variable low-resistance line; and
   a drain located to contact the variable low-resistance line, wherein the variable low-resistance line is formed in a region of the base, the region having a lower electrical resistance than other regions of the base adjacent to the variable low-resistance line,
   the at least two polarization regions are located adjacent to each other in a plane direction perpendicular to a thickness of the base,
   the variable low-resistance line electrically connects the source to the drain,
   the variable low-resistance line is located apart from the gate in a surface direction of the base,
   the variable low-resistance line is formed over a total thickness of the base in a direction perpendicular to a surface of the base, and
   an electric field is applied to the gate such that a direction of a polarization already formed in a region adjacent to the gate is changed to another direction.

2. The non-volatile memory device of claim 1, wherein the at least two polarization regions comprise a first region having a polarization in a first direction and a second region selectively having a polarization in a second direction opposite to the first direction, and
   the variable low-resistance line is between the first region and the second region.

3. The non-volatile memory device of claim 2, wherein the first region and the second region have a same thickness.

4. The non-volatile memory device of claim 2, wherein the second region has a first thickness, and the first region includes a portion having a second thickness greater than the first thickness.

5. The non-volatile memory device of claim 2, wherein the gate is provided to apply an electric field to one of the first region and the second region.

6. The non-volatile memory device of claim 5, wherein the gate is provided to control a polarization direction of a region that is adjacent to at least the gate from among the first region and the second region.

7. The non-volatile memory device of claim 1, wherein the variable low-resistance line is generated or disappeared according to the control of the at least two polarization regions by controlling an electric field through the gate, and after the electric field is removed, a shape of the variable low-resistance line is maintained constant to have non-volatile characteristics of information.

8. The non-volatile memory device of claim 1, wherein a depth of the variable low-resistance line is controlled in a thickness direction of the base by controlling an intensity of the electric field through the gate.

9. The non-volatile memory device of claim 1, wherein a size of the variable low-resistance line is controlled by controlling an application time of the electric field through the gate.

10. The non-volatile memory device of claim 1, wherein the base comprises a ferroelectric material.

11. The non-volatile memory device of claim 1, wherein the variable low-resistance line is maintained even when the electric field applied through the gate is removed.

12. An operating method of a non-volatile memory device comprising: a base comprising a spontaneous polarizable material; a gate arranged adjacent to a surface of the base; and a source and a drain arranged apart from the gate and to contact the base, wherein the operating method includes:
   forming, in the base, a first region having a polarization in a first direction;
   forming a second region that is adjacent to the gate of the first region and has a polarization in a second direction opposite to the first direction, by applying a first voltage to the base through the gate; and
   forming a variable low-resistance line that is located between the first region and the second region and is electrically connected to the source and the drain, by growing the second region by maintaining the first voltage in the base for a first period of time through the gate,
   wherein the first and second regions are located adjacent to each other in a plane direction perpendicular to a thickness of the base,
   the variable low-resistance line electrically connects the source to the drain,
   the variable low-resistance line is located apart from the gate in a surface direction of the base, and
   the variable low-resistance line is formed over a total thickness of the base in a direction perpendicular to a surface of the base.

13. The operating method of claim 12, further comprising:
   converting the second region adjacent to the gate into the first region having the polarization in the first direction by applying a second voltage to the base through the gate; and
   allowing the first region to pass by the variable low-resistance line by growing the first region by maintaining the second voltage in the base for a second period time through the gate.

14. The operating method of claim 13, wherein the second voltage is different from the first voltage.

15. The operating method of claim 13, wherein the second period of time is equal to or longer than the first period of time.

16. The operating method of claim 12, wherein the variable low-resistance line is maintained even when application of the first voltage to the gate ends.

* * * * *